United States Patent [19]

Otaka

[11] Patent Number: 4,803,369
[45] Date of Patent: Feb. 7, 1989

[54] PURIFICATION DEVICE FOR CHARGED PARTICLE BEAM DIAPHRAGM

[75] Inventor: Tadashi Otaka, Katsuta, Japan

[73] Assignee: Hitachi, Ltd., Tokyo, Japan

[21] Appl. No.: 771

[22] Filed: Jan. 6, 1987

[30] Foreign Application Priority Data

Jan. 10, 1986 [JP] Japan ................................ 61-2182

[51] Int. Cl.⁴ ............................................ G01N 23/00
[52] U.S. Cl. .................................... 250/310; 250/311; 250/399; 250/505.1
[58] Field of Search ............ 250/399, 306, 310, 492.3, 250/492.1, 492.2, 396 R, 423 R, 427, 505.1, 311

[56] References Cited

U.S. PATENT DOCUMENTS

| | | |
|---|---|---|
| 4,066,905 | 1/1978 | Daisler et al. .................. 250/396 R |
| 4,135,094 | 1/1979 | Hull ................................. 250/427 |
| 4,471,224 | 9/1984 | Cuomo et al. .................. 250/423 R |

Primary Examiner—Bruce C. Anderson
Attorney, Agent, or Firm—Antonelli, Terry & Wands

[57] ABSTRACT

On a charged particle beam disphragm for confining the angular aperture of a charged particle beam striking a sample, contamination is caused by the impact of the charged particles. A metal material is sputtered by the ion sputtering technique, and the sputtered metal particles are attached over the surface of the contamination incurred on the charged particle beam diaphragm to cover the surface of the contamination. As a result, the charged particle beam diaphragm is substantially purified.

11 Claims, 2 Drawing Sheets

PURIFICATION DEVICE FOR CHARGED PARTICLE BEAM DIAPHRAGM

BACKGROUND OF THE INVENTION

1. Field of the Invention

The present invention relates to a purification device for charged particle beam diaphragm, and in particular to a purification device for charged particle beam diaphragm suitable for use in a charged particle beam device such as an electron microscope, an X-ray microanalyzer with an electronic probe, an ion microanalyzer and an electron beam drawing device for producing semiconductors.

2. Description of the Prior Art

The prior art charged particle beam devices as referred to above are customarily provided with a charged particle beam diaphragm for limiting the angular aperture of the charged particle beam. For example, an electron beam diaphragm of an electron microscope of scanning type referred to as an object diaphragm comprises a thin plate of molybdenum having a thickness of approximately 10 $\mu$m. The thin plate is provided with a plurality of apertures which are close to 100 $\mu$m in diameter.

In general, the diaphragm is baked out in vacuum, and the contaminant such as an oxide on the surface of the diaphragm is then cleared prior to its use. If the surface of the diaphragm is subject to the electron beam, however, hydrocarbon in vacuum is deposited on a part of the diaphragm surface whereto the electron beam is applied. Since the contamination thus deposited is nonconductive, a charged builds up and hence the electron beam which is the charged particle beam is deflected improperly.

In one method for solving the above described problem, the thickness of the diaphragm plate is made so thin that the heat generated by the application of the charged particles may reduce the deposition that is the cause of contamination. In another method for solving the above described problem, the diaphragm plate is used while it is being heated by a current flowing through it.

Contamination is caused not only on the diaphragm plate but also on a holder for holding the diaphragm plate. However, the contamination caused on the holder cannot be substantially removed by means of the above described methods. In general, therefore, the diaphragm plate holder is periodically removed from the vacuum chamber and baked to be purified.

SUMMARY OF THE INVENTION

An object of the present invention is to provide a purification device for a charged particle beam diaphragm which allows for purification while the diaphragm is incorporated in a charged particle beam device.

In accordance with the present invention, a purification device for charged particle beam diaphragm having an aperture to limit the angular aperture of a charged particle beam striking the sample is provided. The purification device comprises a particle generation source made of a conductive material and also comprises means for generating particles of said conductive material so that the generated particles may be attached to the surface of the above described diaphragm that is subject to contact by the charged particle beam.

Other objects and features of the present invention will be apparent from the following description made in conjunction with the drawings.

DESCRIPTION OF THE PREFERRED EMBODIMENTS

Figure 1:
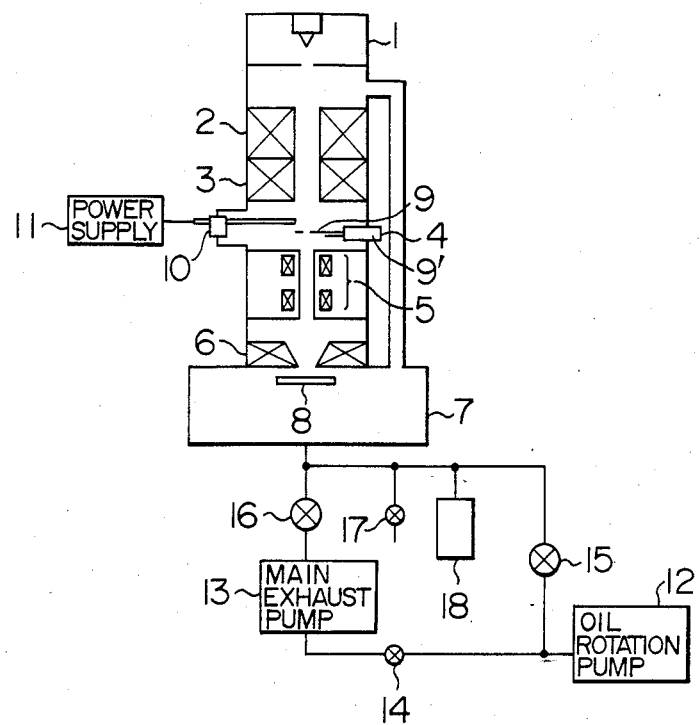
FIG. 1 is a schematic diagram of a scanning electron microscope having an embodiment of a purification device for charged particle beam diaphragm according to the present invention.

In FIG. 1, an electron gun 1, condenser lenses 2 and 3, an objective diaphragm holding device 4 which is a charged particle beam diaphragm device, a deflection coil 5, an objective lens 6, a sample chamber 7, a sample 8, an objective diaphragm 9, a diaphragm holder 9' for holding the object chamber 9, an ion sputter device 10, power supply 11, a rotary oil pump 12, a main exhaust pump 13, valves 14, 15 and 16, a leak valve 17, and a vacuum gauge 18 are illustrated.

In this electron microscope of scanning type, an electron beam, which is a charged particle beam, formed by an electron gun 1, which is a charged particle source, is converged by the condenser lenses 2 and 3 as well as the objective lens 6 to be applied onto the surface of the sample 8. The objective diaphragm holding device 4 carries the objective diaphragm 9 having an aperture on the electro-optical axis in the space between the condenser lens 3 and the objective lens 6. The aperture of the electron beam with respect to the object lens 6 is defined by the object diaphragm plate 9. The ion sputter device 10 is disposed in the vicinity of the object diaphragm plate 9. The exhaust system of this electron microscope of scanning type is composed of the rotary oil pump 12 for preceding suction, the main exhaust pump 13 (which is an oil diffusion pump or an turbo molecular pump), the valves 14, 15 and 16, the leak valve 17, and the vacuum gauge 18.

Figure 2:
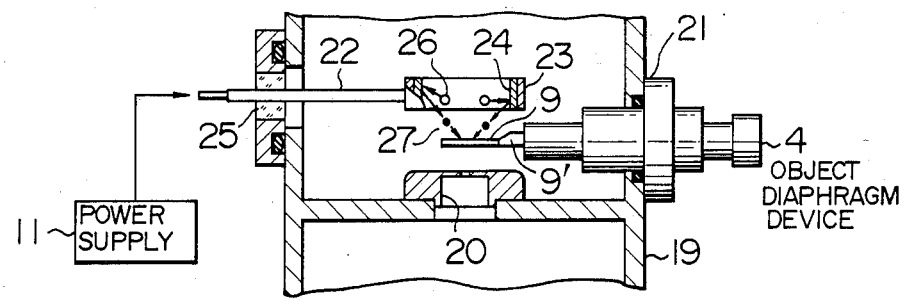
FIG. 2 is a fragmentary sectional view to an enlarged scale of the purification device for charged particle beam diaphragm shown in FIG. 1.

In FIG. 2, a vacuum chamber 19, a fixed diaphragm 20, means 21 for attaching the objective diaphragm device 4 to the vacuum chamber 19, an electrode support 22, an electrode 23, an evaporation source 24 which is a particle generation source, and an insulator 25 are illustrated. The electrode 23 supported by the electrode support 22 takes the shape of a ring and is disposed above the diaphragm plate 9. The evaporation source 24 made of a precious metal which is not readily oxidized at the surface such as gold, platinum or platinum palladium is attached to the electrode 23. The electrode support 22 is electrically insulated from the ground by means of the insulator 25 and is supplied with negative voltage by the power supply 11. The degree of vacuum in the vicinity of the electrode 23 is lowered to 0.2 to 0.02 torr (27 to 2.7 Pa). Negative voltage 500 to 2000 V is then applied to the electrode 23 to cause glow discharge between the electrode 23 and the ground potential portion of objective diaphragm 9. Accordingly, positive ions produced by the glow discharge cause the evaporation source 24 to sputter metal atoms therefrom, the sputtered metal atoms adhering or sticking to the entire objective diaphragm plate 9. The contamination due to hydrocarbon or the like stuck to the device 4 by the application of the electron beam is thus covered by a metal film, resulting in a purified surface. At this time, the metal also adheres to the internal wall of the vacuum chamber in which the objective diaphragm device 4 is disposed. In FIG. 2, the ion 26 and the evaporated particle 27 generated at this time are schematically illustrated.

The electron microscope of scanning type is usually exhausted to produce ultra-high vacuum by the main exhaust pump 13. When evaporation is effected, the electron microscope is exhausted by the rotary oil pump 15 while the air or nitrogen gas is led into the electron microscope via the leak valve 17 to lower the degree of vacuum to 0.2 to 0.02 torr. The glow discharge is thus caused. It is thus possible to cover the surface of the object diaphragm device 4 with a purified and evaporated film without detaching the object diaphragm device 4 at all.

Figure 3A:
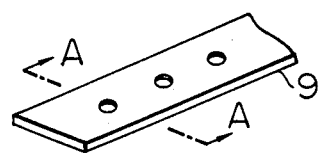
FIG. 3A is an pictorial view of a diaphragm plate shown in FIG. 2.
Figure 3B:
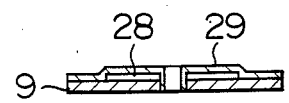
FIG. 3B is an elevation in section taken along a line A—A shown in FIG. 3A.

FIG. 3(a) is an pictorial view of the diaphragm plate. FIG. 3(b) is a sectional view of FIG. 3(a) taken along a line A—A'. Numerals 28 and 29 denote a hydrocarbon film and an evaporated film, respectively. The surface contaminated by the hydrocarbon film 28 upon the application of the electron beam is covered by the evaporated film 29 formed by sputtering, resulting in the purified diaphragm plate 9.

Since the evaporated film 29 is formed by metal atoms implanted by sputtering, the film 29 firmly adheres to the surface so as not to readily peel off.

Figure 4:
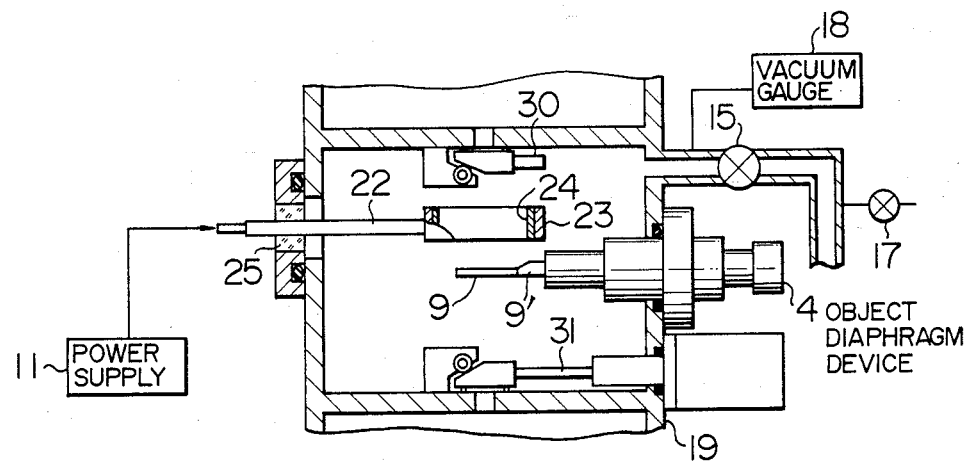
FIG. 4 is a view similar to FIG. 2 of another embodiment of the purification device for charged particle beam diaphragm according to the present invention.

An embodiment shown in FIG. 4 is suitable for a device requiring ultra-high vacuum such as a device having an electron gun section of electric field radiation type or a device using lanthanum hexaboride (LaB$_6$) as the emitter. That is to say, it is possible to purify the objective diaphragm device 4 by means of gate valve devices 30 and 31 without destroying the vacuum within the electron gun chamber and the sample chamber. In this case, the chamber containing the object diaphragm device 4 therein is exhausted by the rotary oil pump 12 via the valve 15 and adjusted to have a degree of vacuum suitable to sputtering by means of the leak valve 17.

In an alternative configuration, the gate valve 31 is omitted while only the gate valve 30 is provided, and only the electron gun chamber is kept at ultra-high vacuum. In this case, the object is attained by providing the whole device excepting the electron gun chamber with a degree of vacuum suitable to sputtering.

The diaphragm plate 9 made of a molybdenum plate in general use has an aperture with diameter close to 100 μm and a thickness close to 10 μm. If the diameter of the aperture as large as 100 μm is allowed to decrease by approximately 10%, the radius of the aperture is allowed to decrease by approximately 5 μm. Assuming that the evaporation thickness caused by a single sputtering attempt is 10 nm (100 Å), therefore, coating by sputtering can be carried out to the extent of 500 times. Accordingly, the diaphragm plate can be used semipermanently. In addition, the diaphragm plate 9 can be used without destroying the vacuum to purify the diaphragm plate 9 and without dismantling the objective diaphragm device 4. Not only the diaphragm plate 9 but also the entire internal face of the vacuum chamber 19 including the diaphragm plate 9 are coated with the metal by such sputtering. Even when the acceleration voltage of the charged particle beam is low, therefore, high performance can be maintained. Even in case where the diaphragm plate 9 removed from the device undergoes the baking and purifying process in a different vacuum chamber and is then taken out from the different vacuum chamber to be mounted again, the surface oxidation progresses. When low acceleration voltage of 1,000 V or less is used in such prior art, complete purification is impossible. On the contrary, the present invention provides a completely purified surface.

The embodiment has heretofore been described by taking an electron microscope of scanning type as an example. Even in the device using a particle beam such as an electron microscope of transmission type or an electron beam drawing device, however, the similar effect can be obtained by applying the present invention to a diaphragm device for defining the angular aperture of the particle line. Further, all of these devices have the vacuum exhaust system. It is thus possible to easily attain the degree of vacuum for effecting sputtering, resulting in a low cost.

I claim:

1. An electron beam apparatus comprising:
   an evacuated envelope;
   means for generating an electron beam in said envelope;
   means for converging the electron beam on a sample;
   a diaphragm plate positioned between the beam generating means and said sample, said plate having an aperture for defining an angular aperture of the electron beam;
   means for holding the diaphragm plate in such a location as to become contaminated by reason of an association with the electron beam;
   means for generating electrically conductive particles at a position adjacent the beam diaphragm while the beam diaphragm remains in the envelope; and
   means for keeping the beam diaphragm at a degree of vacuum different from the degree of vacuum at the electron beam generating means under conditions so that said particles attach to the surfaces of the diaphragm plate and the diaphragm plate holding means while said diaphragm plate and diaphragm plate holding means remain in said envelope.

2. An electron beam apparatus according to claim 1, wherein said electrically conductive particle generating means comprises an electrically conductive member and means for generating ions which bombard the electrically conductive member so that the electrically conductive particles are generated from the electrically conductive member.

3. An electron beam apparatus according to claim 2, wherein the electrically conductive member is made of metal.

4. An electron beam apparatus according to claim 2, wherein the electrically conductive member is a precious metal.

5. An electron beam apparatus comprising means for generating an electron beam;
   means for converging the electron beam on a sample;
   a diaphragm plate having an aperture for defining the angular aperture of the electron beam;
   means for holding the diaphragm plate in such a location as to become contaminated by reason of an association with the electron beam;
   an electrically conductive member; and means for causing a glow discharge between the electrically conductive member and the diaphragm plate to thereby generate ions which cause the electrically conductive member to sputter electrically conductive particles that attach to surfaces of the diaphragm plate and the diaphragm plate holding means.

6. An electron beam apparatus according to claim 5, wherein the electrically conductive member is made of metal.

7. An electron beam apparatus according to claim 5, wherein the electrically conductive member is made of a precious metal.

8. An electron beam apparatus according to claim 7, wherein the electrically conductive member has the shape of a ring.

9. An electron beam apparatus according to claim 5, which further comprises means for substantially interrupting in vacuum the diaphragm plate and the diaphragm plate holding means from the electron generating means during a predetermined time and means for keeping the diaphragm plate and the diaphragm plate holding means at a degree of vacuum lower than that of the electron beam generating means during said predetermined time.

10. A charged particle beam apparatus comprising:
a charged particle generating means;
a beam diaphragm;
a sample surface; and
a beam purification device comprising means for generating electrically conductive particles at a position adjacent said beam diaphragm while the diaphragm remains in the charged particle beam apparatus, and means for keeping the beam diaphragm at a degree of vacuum different from the degree of vacuum at the charged particle generating means when said electrically conductive particles are generated whereby said conductive particles are adhered to said beam diaphragm.

11. A charged particle beam apparatus as defined in claim 10, wherein the beam diaphragm comprises a plate having an aperture which defines an angular aperture of a beam of charged particles from said charged particle generating means; and wherein the electrically conductive particle generating means includes an electrically conductive member and means for causing a glow discharge between said electrically conductive member and said plate to cause the electrically conductive member to sputter electrically conductive particles that adhere to surfaces of said plate.

* * * * *